United States Patent
Seo

(10) Patent No.: US 8,149,036 B2
(45) Date of Patent: Apr. 3, 2012

(54) SEMICONDUCTOR DEVICE

(75) Inventor: Young-Suk Seo, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 119 days.

(21) Appl. No.: 12/792,283

(22) Filed: Jun. 2, 2010

(65) Prior Publication Data

US 2011/0001532 A1 Jan. 6, 2011

(30) Foreign Application Priority Data

Jul. 1, 2009 (KR) .................. 10-2009-0059718

(51) Int. Cl.
*H03K 3/017* (2006.01)
(52) U.S. Cl. ...................... 327/175; 327/158
(58) Field of Classification Search .............. None
See application file for complete search history.

(56) References Cited

U.S. PATENT DOCUMENTS

| 7,782,106 B2* | 8/2010 | Shin et al. ............ 327/175 |
| 7,940,095 B2* | 5/2011 | Hur .................... 327/158 |
| 2004/0095174 A1* | 5/2004 | Hong et al. ............ 327/175 |

FOREIGN PATENT DOCUMENTS

| KR | 1020040037786 | 5/2004 |
| KR | 1020060135234 | 12/2006 |
| KR | 1020070069385 | 7/2007 |
| KR | 100808594 | 3/2008 |

* cited by examiner

*Primary Examiner* — Cassandra Cox
(74) *Attorney, Agent, or Firm* — IP & T Group LLP

(57) ABSTRACT

A semiconductor device includes a phase division unit, a clock delay unit, a duty cycle correction clock generation unit, and a duty cycle correction voltage generation unit. The phase division unit is configured to divide a phase of a source clock to generate a first division clock. The clock delay unit is configured to delay the first division clock by a delay amount corresponding to a voltage level of a duty cycle correction voltage to output a second division clock. The duty cycle correction clock generation unit is configured to generate a duty cycle correction clock whose logic level changes at respective edges of the first division clock and the second division clock. The duty cycle correction voltage generation unit is configured to generate the duty cycle correction voltage whose voltage level changes depending on a duty cycle of the duty cycle correction clock.

32 Claims, 5 Drawing Sheets

SEMICONDUCTOR DEVICE

CROSS-REFERENCE TO RELATED APPLICATIONS

The present application claims priority of Korean Patent Application No. 10-2009-0059718, filed on Jul. 1, 2009, which is incorporated herein by reference in its entirety.

BACKGROUND OF THE INVENTION

Exemplary embodiments of the present invention relate to a semiconductor design technology, and more particularly, to a duty cycle correction (DCC) circuit of a semiconductor device.

Double data rate (DDR) technology was developed in order to improve characteristics of a memory system, and in particular a bandwidth of a memory system. A memory system is designed to use rising and falling edges of an internal clock. In this case, a duty cycle of an internal clock is an important factor for maximally securing a timing margin of a high-performance memory system.

When a duty cycle of an internal clock is not accurately maintained at a 50% ratio, an error corresponding to an offset from 50% ratio reduces a timing margin of a high-performance memory system. Therefore, there is a demand for an apparatus which compensates for a distortion of a duty cycle caused by process, voltage, and temperature (PVT) variations. A DCC circuit used in a delay locked loop (DLL) is a circuit which corrects a duty cycle of an internal clock used in a memory system.

FIG. 1 is a block diagram and a timing diagram illustrating the configuration and operation of a DCC circuit of a conventional semiconductor device.

Referring to the block diagram of FIG. 1, the DCC circuit includes a DLL 100 and a phase division unit 120. The DLL 100 compares phases of source clocks CLK and CLKB, which are inputted from the outside, with a phase of a feedback clock FBCLK, which is generated by reflecting/applying an actual delay amount (a replica delay) of a source clock (CLK, CLKB) path in/to a DLL clock DLLCLK. Then, the DLL 100 delays the source clocks CLK and CLKB by a delay time corresponding to a comparison result, and outputs the DLL clock DLLCLK. The phase division unit 120 divides a phase of the DLL clock DLLCLK according to a set division ratio and generates a DLL division clock DIV_DLLCLK.

The timing diagram of FIG. 1 shows that a duty cycle of the DLL clock DLLCLK outputted from the DLL 100 is not maintained at a 50% ratio. That is, the length of a logic high duration of the DLL clock DLLCLK is shorter than the length of a logic low duration of the DLL clock DLLCLK.

If the phase of the DLL clock DLLCLK whose duty cycle is not maintained at the 50% ratio is divided by a half through the phase division unit 120 and then outputted as the DLL division clock DIV_DLLCLK, the duty cycle of the DLL division clock DIV_DLLCLK is accurately maintained at the 50% ratio.

Since the phase division unit 120 makes the duration of one cycle (1 tck) of the DLL clock DLLCLK equal to the duration of a half cycle (½ tck) of the DLL division clock DIV_DLLCLK, the DLL division clock DIV_DLLCLK can always maintain the duty cycle at the 50% ratio even though the logic high duration and the logic low duration, have different lengths in one cycle (1 tck) of the DLL clock DLLCLK.

However, since the DLL division clock DIV_DLLCLK is outputted by dividing the phase of the DLL clock DLLCLK by a half, the DLL division clock DIV_DLLCLK has half the frequency of the DLL clock DLLCLK. When a semiconductor device operates with the DLL division clock DIV_DLLCLK having the lowered frequency, the semiconductor device operates at a low operating speed.

Therefore, in order for the semiconductor device to maintain a desired operating speed by using the clock whose duty cycle is corrected by the above-described conventional method, the semiconductor device is to use the DLL clock outputted from the DLL 100, which has a frequency higher than a frequency of the internal clock according to the operating speed of the semiconductor device.

That is, the above-described DCC method may not be desired for high-speed semiconductor devices which use a relatively high frequency of clock.

SUMMARY OF THE INVENTION

Exemplary embodiments of the present invention are directed to a DCC circuit of a semiconductor device, which is capable of providing a high speed operation and a low current consumption, while occupying a small area.

In accordance with an exemplary embodiment of the present invention, a semiconductor device includes a delay locked loop (DLL) configured to compare a phase of a source clock with a phase of a feedback clock and delay the source clock depending on a comparison result to output a DLL clock, the feedback clock being generated by reflecting an actual delay amount of a source clock path in the DLL clock, a phase division unit configured to divide a phase of the DLL clock according to a certain division ratio to generate a first DLL division clock, a clock delay unit configured to delay the first DLL division clock by a delay amount corresponding to a voltage level of a duty cycle correction voltage to output a second DLL division clock, a duty cycle correction clock generation unit configured to generate a duty cycle correction clock whose logic level changes at respective edges of the first DLL division clock and the second DLL division clock, and a duty cycle correction voltage generation unit configured to generate the duty cycle correction voltage whose voltage level changes depending on a duty cycle of the duty cycle correction clock.

In accordance with another exemplary embodiment of the present invention, a semiconductor device includes a phase division unit configured to divide a phase of a source clock according to a certain division ratio to generate a first division clock, a clock delay unit configured to delay the first division clock by a delay amount corresponding to a voltage level of a duty cycle correction voltage to output a second division clock, a duty cycle correction clock generation unit configured to generate a duty cycle correction clock whose logic level changes at respective edges of the first division clock and the second division clock, and a duty cycle correction voltage generation unit configured to generate the duty cycle correction voltage whose voltage level changes depending on a duty cycle of the duty cycle correction clock.

DESCRIPTION OF SPECIFIC EMBODIMENTS

Figure 1:
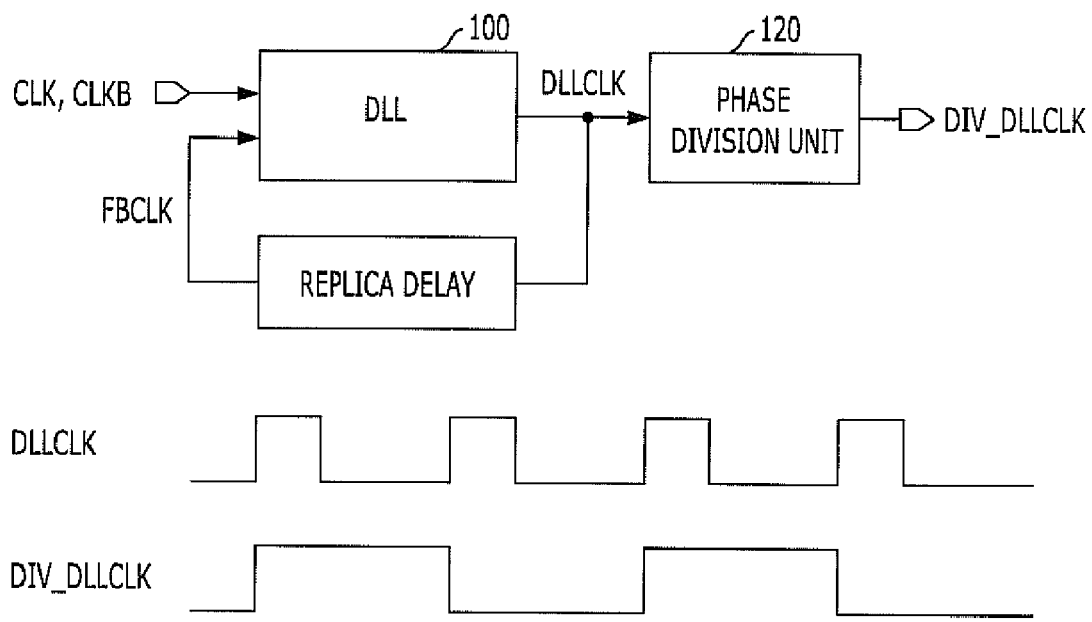
FIG. 1 is a block diagram and a timing diagram illustrating the configuration and operation of a DCC circuit of a conventional semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
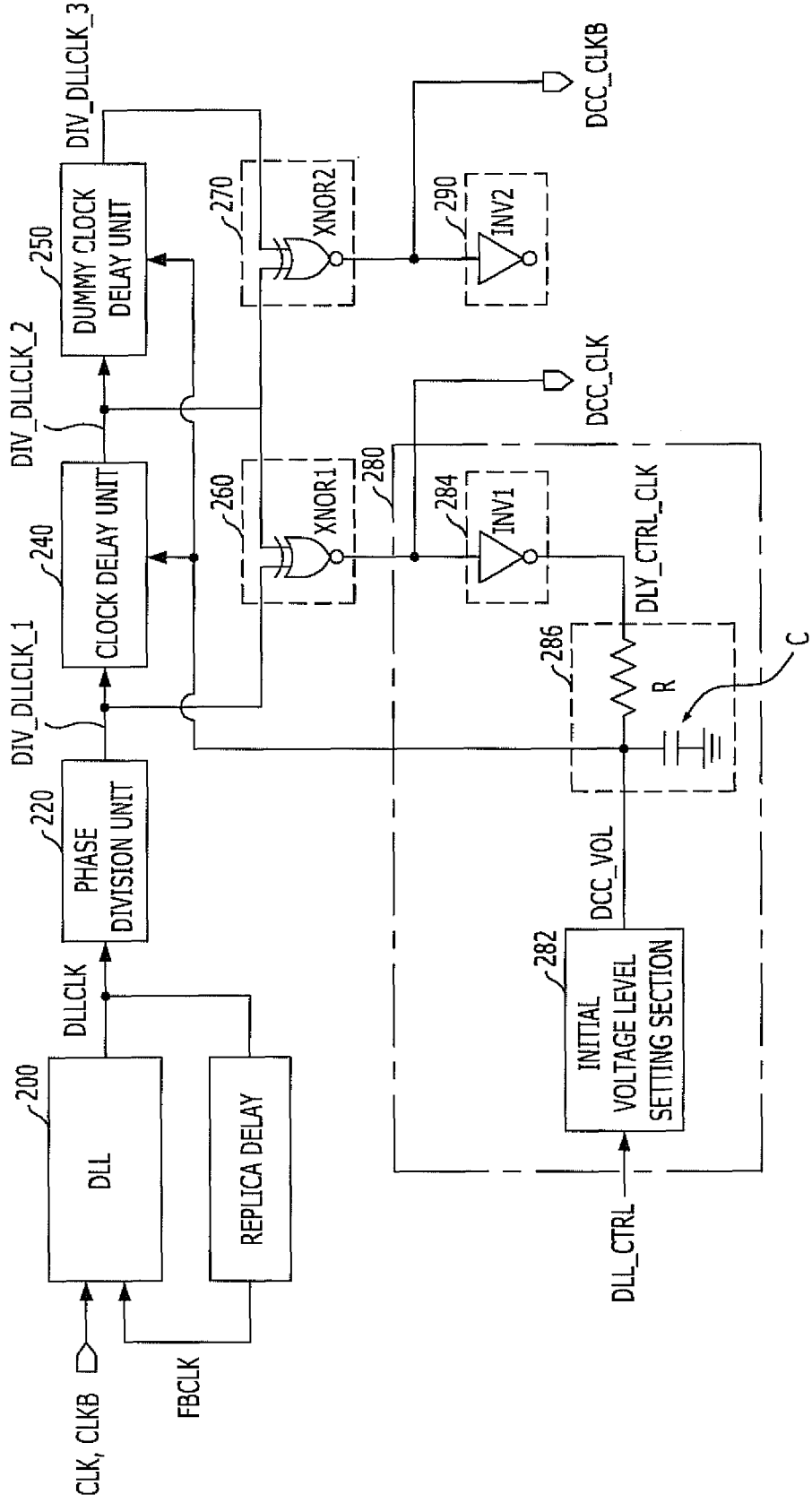
FIG. 2 is a block diagram illustrating the configuration of a DCC circuit in accordance with an exemplary embodiment of the present invention.

FIG. 2 is a block diagram illustrating the configuration of a DCC circuit in accordance with an exemplary embodiment of the present invention.

Referring to FIG. 2, the DCC circuit in accordance with the embodiment of the present invention includes a DLL 200, a phase division unit 220, a clock delay unit 240, a duty cycle correction clock generation unit 260, and a duty cycle correction voltage generation unit 280. The DLL 200 compares phases of source clocks CLK and CLKB with a phase of a feedback clock FBCLK, which is generated by reflecting/applying an actual delay amount (a replica delay) of a source clock (CLK, CLKB) path in/to a DLL clock DLLCLK. Then, the DLL 200 delays the source clocks CLK and CLKB by a delay amount corresponding to a comparison result to output the DLL clock DLLCLK. The phase division unit 220 divides a phase of the DLL clock DLLCLK according to a certain division ratio to generate a first DLL division clock DIV_DLLCLK_1. The clock delay unit 240 delays the first DLL division clock DIV_DLLCLK_1 by a delay amount corresponding to a level of a duty cycle correction voltage DCC_VOL to output a second DLL division clock DIV_DLLCLK_2. The duty cycle correction clock generation unit 260 generates a duty cycle correction clock DCC_CLK whose logic level changes at the respective edges of the first DLL division clock DIV_DLLCLK_1 and the second DLL division clock DIV_DLLCLK_2. The duty cycle correction voltage generation unit 280 generates the duty cycle correction voltage DCC_VOL whose voltage level changes depending on the duty cycle ratio of the duty cycle correction clock DCC_CLK.

Also, the DCC circuit further includes a dummy clock delay unit 250 and an inverted duty cycle correction clock generation unit 270. The dummy clock delay unit 250 delays the second DLL division clock DIV_DLLCLK_2 by the delay amount corresponding to the level of the duty cycle correction voltage DCC_VOL to output a third DLL division clock DIV_DLLCLK_3. The inverted duty cycle correction clock generation unit 270 generates an inverted duty cycle correction clock DCC_CLKB whose logic level changes at the respective edges of the second DLL division clock DIV_DLLCLK_2 and the third DLL division clock DIV_DLLCLK_3.

Also, the DCC circuit further includes a dummy clock inversion driving unit 290 which is coupled to an output terminal of the inverted duty cycle correction clock generation unit 270, and inverts the inverted duty cycle correction clock DCC_CLKB.

The duty cycle correction clock generation unit 260 includes an exclusive NOR (XNOR) gate XNOR1 which performs an XNOR operation on the first DLL division clock DIV_DLLCLK_1 and the second DLL division clock DIV_DLLCLK_2 which are received through a first input terminal and a second input terminal, respectively, and outputs the duty cycle correction clock DCC_CLK.

The inverted duty cycle correction clock generation unit 270 includes an exclusive NOR (XNOR) gate XNOR2 which performs an XNOR operation on the second DLL division clock DIV_DLLCLK_2 and the third DLL division clock DIV_DLLCLK_3 which are received through a first input terminal and a second input terminal, respectively, and outputs the inverted duty cycle correction clock DCC_CLKB.

The duty cycle correction voltage generation unit 280 includes an initial voltage level setting section 282, a clock inversion driving section 284, and a voltage level changing section 286. The initial voltage level setting section 282 sets an initial voltage level of a duty cycle correction voltage (DCC_VOL) terminal in response to an operation control signal DLL_CTRL. The clock inversion driving section 284 inverts the duty cycle correction clock DCC_CLK to output a delay control clock DLY_CTRL_CLK. The voltage level changing section 286 changes the voltage level of the duty cycle correction voltage (DCC_VOL) terminal according to a duty cycle of the delay control clock DLY_CTRL_CLK.

The clock inversion driving section 284 of the duty cycle correction voltage generation unit 280 includes an inverter INV1 which receives the duty cycle correction clock DCC_CLK and outputs the delay control clock DLY_CTRL_CLK.

The voltage level changing unit 286 of the duty cycle correction voltage generation unit 280 includes a resistor R coupled between a delay control clock (DLL_CTRL_CLK) terminal and the duty cycle correction voltage (DCC_VOL) terminal, and a capacitor C coupled between the duty cycle correction voltage (DCC_VOL) terminal and a ground voltage (VSS) terminal.

Figure 3:
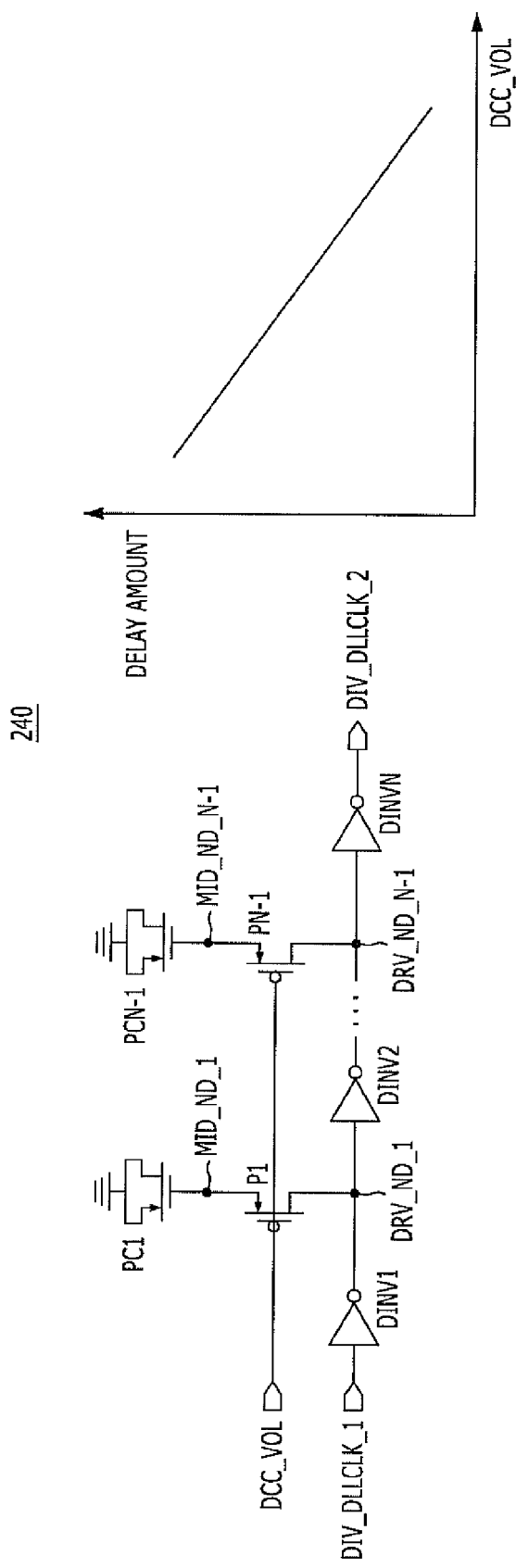
FIG. 3 is a circuit diagram and a graph illustrating the configuration and operation of a clock delay unit of the DCC circuit shown in FIG. 2.

FIG. 3 is a circuit diagram and a graph illustrating the configuration and operation of the clock delay unit 240 of the DCC circuit shown in FIG. 2.

Referring to FIG. 3, the clock delay unit 240 includes a plurality of inverters DINV1, DINV2, . . . , DINVN coupled in series between a clock input terminal and a clock output terminal, a plurality of PMOS transistors P1, . . . , PN−1 configured to adjust a magnitude of a current flowing between mid nodes MID_ND_1, . . . , MID_ND_N−1, coupled to sources thereof, and driving nodes DRV_ND_1, . . . , DRV_ND_N−1 coupled to drains thereof, depending on the level of the duty cycle correction voltage DCC_VOL applied to gates thereof, and a plurality of PMOS transistors PC1, . . . , PCN−1 coupled in a capacitor structure between the mid nodes MID_ND_1, . . . , MID_ND_N−1, respectively, and the ground voltage (VSS) terminal.

The operation of the DCC circuit having the above-mentioned configuration in accordance with the embodiment of the present invention is described below.

First, the operation of the DLL 200 is described briefly. A delay amount corresponding to a phase difference between reference edges of the source clocks CLK and CLKB and reference edges of the feedback clock FBCLK is applied to the source clocks CLK and CLKB to output the DLL clock DLLCLK. The reference edges of the clocks generally refer to the rising edges, but they may be the falling edges.

Since the DLL 200 determines only whether the phases of the reference edges of the source clocks CLK and CLKB and the feedback clock FBCLK coincide with each other, the DLL 200 cannot correct the duty cycles of the source clock CLK and CLKB even if the source clocks CLK and CLKB are distorted. Furthermore, since the source clocks CLK and CLKB transferred from the outside are distorted during the transfer procedure, the DLL clock DLLCLK outputted from the DLL 200 is also distorted, and thus, does not maintain a duty cycle at a desired ratio.

The phase division unit 220 divides the phase of the DLL clock DLLCLK by half to generate the first DLL division clock DIV_DLLCLK_1 having half the frequency of the DLL clock DLLCLK.

The duty cycle of the first DLL division clock DIV_DLLCLK_1 outputted from the phase division unit 220 is accurately maintained at a 50% ratio, without distortion. Since the phase division unit 220 operates to make the first DLL division clock DIV_DLLCLK_1 have logic high and low durations each corresponding to one cycle (1 tck) of the DLL clock DLLCLK, the first DLL division clock DIV_DLLCLK_1 can always maintain the duty cycle, i.e., the proportion of the high duration in one cycle, at the 50% ratio even though the logic high duration and the logic low duration of the DLL clock DLLCLK are different in one cycle (1 tck) of the DLL clock DLLCLK.

The clock delay unit 240 outputs the second DLL division clock DIV_DLLCLK_2 by delaying the first DLL division clock DIV_DLLCLK_1 by the delay amount varying depending on the level of the duty cycle correction voltage DCC_VOL.

That is, the clock delay unit 240 outputs the second DLL division clock DIV_DLLCLK_2 by delaying the first DLL division clock DIV_DLLCLK_1 by an initial delay amount set according to the set initial voltage level of the duty cycle correction voltage DCC_VOL. Then, the clock delay unit 240 outputs the second DLL division clock DIV_DLLCLK_2 by delaying the first DLL division clock DIV_DLLCLK_1 by a decreasing delay amount according to an increase in the level of the duty cycle correction voltage DCC_VOL. Also, the clock delay unit 240 outputs the second DLL division clock DIV_DLLCLK_2 by delaying the first DLL division clock DIV_DLLCLK_1 by an increasing delay amount according to a decrease in the level of the duty cycle correction voltage DCC_VOL.

The delay amount varying according to the level of the duty cycle correction voltage DCC_VOL in the clock delay unit 240 is described with reference to FIG. 3. First, the plurality of inverters DINV1, DINV2, . . . , DINVN coupled in series outputs the second DLL division clock DIV_DLLCLK_2 by delaying the first DLL division clock DIV_DLLCLK_1 inputted through the clock input terminal by a set minimum delay amount.

The plurality of PMOS transistors P1, . . . , PN−1 determine how much the capacitances of the PMOS transistors PC1, . . . , PCN−1 influence the driving nodes DRV_ND_1, . . . , DRV_ND_N−1, disposed between the respective inverters DINV1, DINV2, . . . , DINVN, according to the level of the duty cycle correction voltage DCC_VOL.

That is, when the level of the duty cycle correction voltage DCC_VOL increases, the magnitude of the current flowing between the mid nodes MID_ND_1, . . . , MID_ND_N−1 and the driving nodes DRV_ND_1, . . . , DRV_ND_N−1 is decreased to reduce the influence of the capacitances of the PMOS transistors PC1, . . . , PCN−1 on the driving nodes DRV_ND_1, . . . , DRV_ND_N−1. On the other hand, when the level of the duty cycle correction voltage DCC_VOL decreases, the magnitude of the current flowing between the mid nodes MID_ND_1, . . . , MID_ND_N−1 and the driving nodes DRV_ND_1, . . . , DRV_ND_N−1 is increased to increase the influence of the capacitances of the PMOS transistors PC1, . . . , PCN−1 on the driving nodes DRV_ND_1, . . . , DRV_ND_N−1.

Like the graph shown in FIG. 3, as the capacitances of the PMOS transistors PC1, . . . , PCN−1 coupled in the capacitor structure increasingly influence the driving nodes DRV_ND_1, . . . , DRV_ND_N−1 disposed between the respective inverters DINV1, DINV2, . . . , DINVN, the second DLL division clock DIV_DLLCLK_2 is outputted by delaying the first DLL division clock DIV_DLLCLK_1 by an increasing delay amount. Meanwhile, as the capacitances of the PMOS transistors PC1, . . . , PCN−1 coupled in the capacitor structure decreasingly influence the driving nodes DRV_ND_1, . . . , DRV_ND_N−1 disposed between the respective inverters DINV1, DINV2, . . . , DINVN, the second DLL division clock DIV_DLLCLK_2 is outputted by delaying the first DLL division clock DIV_DLLCLK_1 by a decreasing delay amount.

The dummy clock delay unit 250 outputs the third DLL division clock DIV_DLLCLK_3 by delaying the second DLL division clock DIV_DLLCLK_2 by the delay amount varying depending on the level of the duty cycle correction voltage DCC_VOL.

That is, the dummy clock delay unit 250 performs the substantially same internal operation as the clock delay unit 240. Specifically, the dummy clock delay unit 250 outputs the third DLL division clock DIV_DLLCLK_3 by delaying the second DLL division clock DIV_DLLCLK_2 by an initial delay amount set according to the set initial voltage level of the duty cycle correction voltage DCC_VOL. Then, the dummy clock delay unit 250 outputs the third DLL division clock DIV_DLLCLK_3 by delaying the second DLL division clock DIV_DLLCLK_2 by a decreasing delay amount according to an increase in the level of the duty cycle correction voltage DCC_VOL. Also, the dummy clock delay unit 250 outputs the third DLL division clock DIV_DLLCLK_3 by delaying the second DLL division clock DIV_DLLCLK_2 by an increasing delay amount according to a decrease in the level of the duty cycle correction voltage DCC_VOL.

Therefore, the dummy clock delay unit 250 has the substantially same internal circuits as the clock delay unit 240 of FIG. 3, except that the inputted clock is not the first DLL division clock DIV_DLLCLK_1 but the second DLL division clock DIV_DLLCLK_2, and the outputted clock is not the second DLL division clock DIV_DLLCLK_2 but the third DLL division clock DIV_DLLCLK_3.

The duty cycle correction clock generation unit 260 generates the duty cycle correction clock DCC_CLK whose logic level changes at the respective edges of the first DLL division clock DIV_DLLCLK_1 and the second DLL division clock DIV_DLLCLK_2. The edges of the first DLL division clock DIV_DLLCLK_1 and the second DLL division clock DIV_DLLCLK_2 include both the rising edges and the falling edges.

Specifically, the duty cycle correction clock generation unit 260 illustrated in FIG. 2 performs an operation that changes the logic level of the duty cycle correction clock DCC_CLK to a logic high level at the respective edges of the first DLL division clock DIV_DLLCLK_1, and changes the logic level of the duty correction clock DCC_CLK to a logic low level at the respective edges of the second DLL division clock DIV_DLLCLK_2.

That is, when the duty cycle correction clock DCC_CLK is at a logic low level prior to the timing in which the rising edge or the falling edge of the first DLL division clock DIV_DLLCLK_1 is generated, the duty cycle correction clock DCC_CLK changes to a logic high level. When the duty cycle correction clock DCC_CLK is at a logic high level prior to the timing in which the rising edge or the falling edge of the first DLL division clock DIV_DLLCLK_1 is generated, the duty cycle correction clock DCC_CLK is maintained at a logic high level.

Likewise, when the duty cycle correction clock DCC_CLK is at a logic low level prior to the timing in which the rising edge or the falling edge of the second DLL division clock DIV_DLLCLK_2 is generated, the duty cycle correction clock DCC_CLK is maintained at a logic low level. When the duty cycle correction clock DCC_CLK is at a logic high level prior to the timing in which the rising edge or the falling edge of the second DLL division clock DIV_DLLCLK_2 is generated, the duty cycle correction clock DCC_CLK changes to a logic low level.

However, unlike the exemplary embodiment of FIG. 2, the duty cycle correction clock generation unit 260 may perform an operation that changes the duty cycle correction clock DCC_CLK to a logic low level at the respective edges of the first DLL division clock DIV_DLLCLK_1, and changes the duty cycle correction clock DCC_CLK to a logic high level at the respective edges of the second DLL division clock DIV_DLLCLK_2.

In order to implement the duty cycle correction clock generation unit 260 to perform the above-described operation, the duty cycle correction clock generation unit 260 may include an XNOR gate XNOR1 which performs an XNOR operation on the first DLL division clock DIV_DLLCLK_1 and the second DLL division clock DIV_DLLCLK_2, which are received through a first input terminal and a second input terminal, respectively, and outputs the duty cycle correction clock DCC_CLK.

The inverted duty cycle correction clock generation unit 270 generates the inverted duty cycle correction clock DCC_CLKB whose logic level changes at the respective edges of the second DLL division clock DIV_DLLCLK_2 and the third DLL division clock DIV_DLLCLK_3. The respective edges of the second DLL division clock DIV_DLLCLK_2 and the third DLL division clock DIV_DLLCLK_3 include both the rising edges and the falling edges.

Specifically, the inverted duty cycle correction clock generation unit 270 illustrated in FIG. 2 performs an operation which changes the inverted duty cycle correction clock DCC_CLKB to a logic high level at the respective edges of the second DLL division clock DIV_DLLCLK_2, and changes the inverted duty cycle correction clock DCC_CLKB to logic low level at the respective edges of the third DLL division clock DIV_DLLCLK_3.

That is, when the inverted duty cycle correction clock DCC_CLKB is at a logic low level prior to the timing in which the rising edge or the falling edge of the second DLL division clock DIV_DLLCLK_2 is generated, the inverted duty cycle correction clock DCC_CLKB changes to a logic high level. When the inverted duty cycle correction clock DCC_CLKB is at a logic high level prior to the timing in which the rising edge or the falling edge of the second DLL division clock DIV_DLLCLK_2 is generated, the inverted duty cycle correction clock DCC_CLKB is maintained at a logic high level.

Likewise, when the inverted duty cycle correction clock DCC_CLKB is at a logic low level prior to the timing in which the rising edge or the falling edge of the third DLL division clock DIV_DLLCLK_3 is generated, the inverted duty cycle correction clock DCC_CLKB is maintained at a logic low level. When the inverted duty cycle correction clock DCC_CLKB is at a logic high level prior to the timing in which the rising edge or the falling edge of the third DLL division clock DIV_DLLCLK_3 is generated, the inverted duty cycle correction clock DCC_CLKB changes to a logic low level.

However, unlike the exemplary embodiment of FIG. 2, the inverted duty cycle correction clock generation unit 270 may perform an operation that changes the inverted duty cycle correction clock DCC_CLKB to a logic low level at the respective edges of the second DLL division clock DIV_DLLCLK_2, and changes the inverted duty cycle correction clock DCC_CLKB to a logic high level at the respective edges of the third DLL division clock DIV_DLLCLK_3.

In order to implement the inverted duty cycle correction clock generation unit 270 to perform the above-described operation, the inverted duty cycle correction clock generation unit 270 includes an XNOR gate XNOR2 which performs an XNOR operation on the second DLL division clock DIV_DLLCLK_2 and the third DLL division clock DIV_DLLCLK_3, which are received through a first input terminal and a second input terminal, respectively, and outputs the inverted duty cycle correction clock DCC_CLKB.

The clock inversion driving section 284 of the duty cycle correction voltage generation unit 280 performs an operation which inverts the phase of the duty cycle correction clock DCC_CLK outputted from the duty cycle correction clock generation unit 260 and outputs the delay control clock DLY_CTRL_CLK.

The clock inversion driving section 284 includes an inverter INV1 implemented with one PMOS transistor and one NMOS transistor and configured to invert the phase of the duty cycle correction clock DCC_CLK and output the delay control clock DLY_CTRL_CLK.

The clock inversion driving unit 284 is provided within the duty cycle correction voltage generation unit 280 so that the duty cycle correction clock DCC_CLK outputted to the outside with the corrected duty cycle can be separated from the delay control clock DLY_CTRL_CLK. When the voltage level changing section 286 of the duty cycle correction voltage generation unit 280 performs an operation which changes the level of the duty cycle correction voltage DCC_VOL by using the delay control clock DLY_CTRL_CLK, the phase of the duty cycle correction clock DCC_CLK can be prevented from being affected by the operation of the voltage level changing section 286.

Due to the clock inversion driving section 284 provided within the duty cycle correction voltage generation unit 280, a dummy clock inversion driving unit 290 is coupled to the output terminal of the inverted duty cycle correction clock generation unit 270. That is, the clock inversion driving section 284 is coupled to the output terminal of the duty cycle correction clock generation unit 260, and the phase of the duty cycle correction clock DCC_CLK outputted form the duty cycle correction clock generation unit 260 is opposite to the phase of the inverted duty cycle correction clock DCC_CLKB outputted from the inverted duty cycle correction clock generation unit 270. Therefore, in order for the loading value at the output terminal of the duty correction clock generation unit 260 to be equal to that of the inverted duty cycle correction generation unit 270, the dummy clock inversion driving unit 290 corresponding to the clock inversion driving section 284 is coupled to the output terminal of the inverted duty cycle correction clock generation unit 270.

The voltage level changing section 286 of the duty cycle correction voltage generation unit 280 performs an operation which changes the voltage level of the duty cycle correction voltage (DCC_VOL) terminal according to the duty cycle of the delay control clock DLY_CTRL_CLK. Specifically, the voltage level changing section 286 includes a resistor R and a capacitor C. The resistor R is coupled between the delay control clock (DLY_CTRL_CLK) input terminal and the duty cycle correction voltage (DCC_VOL) terminal and has a set resistance. The capacitor C is coupled between the duty cycle correction voltage (DCC_VOL) terminal and the ground voltage (VSS) terminal and has a set capacitance. The voltage level changing section 286 performs an operation which changes the level of the duty cycle correction voltage (DCC_VOL) terminal by low-pass filtering the delay control clock DLY_CTRL_CLK.

That is, the voltage level changing section 286 performs an operation which increases the level of the duty cycle correction voltage (DCC_VOL) terminal in the logic high duration of the delay control clock DLY_CTRL_CLK, and decreases the level of the duty cycle correction voltage (DCC_VOL) terminal in the logic low duration of the delay control clock DLY_CTRL_CLK.

Therefore, when the length of the logic high duration of the delay control clock DLY_CTRL_CLK is longer than the length of the logic low duration of the delay control clock DLY_CTRL_CLK, the level of the duty cycle correction voltage (DCC_VOL) terminal becomes higher than the initial voltage level of the duty cycle correction voltage (DCC_VOL) terminal.

On the other hand, when the length of the logic high duration of the delay control clock DLY_CTRL_CLK is shorter than the length of the logic low duration of the delay control clock DLY_CTRL_CLK, the level of the duty cycle correction voltage (DCC_VOL) terminal becomes lower than the initial voltage level of the duty cycle correction voltage (DCC_VOL) terminal.

The initial voltage level setting section 282 of the duty cycle correction voltage generation unit 280 performs an operation which sets the initial voltage level of the duty cycle correction voltage (VCC_VOL) terminal according to the logic level of the operation control signal DLL_CTRL. Specifically, the initial voltage level setting section 282 performs an operation which sets the initial voltage level of the duty cycle correction voltage (DCC_VOL) terminal by applying a division voltage to the duty cycle correction voltage (DCC_VOL) terminal according to the logic level of the operation control signal DLL_CTRL. The division voltage is generated by dividing the level of an external power supply voltage VDD at a set division ratio. The division voltage generally has half the level of the external power supply voltage VDD, and the level of the division voltage may be varied by a circuit design.

That is, the initial voltage level setting section 282 applies the division voltage to the duty cycle correction voltage (DCC_VOL) terminal during a deactivation of the operation control signal DLL_CTRL to a logic low level. The duty cycle correction voltage (DCC_VOL) terminal is maintained at the level of the division voltage. The initial voltage level setting section 282 does not apply the division voltage to the duty cycle correction voltage (DCC_VOL) terminal during an activation of the operation control signal DLL_CTRL to a logic high level. The duty cycle correction voltage (DCC_VOL) terminal has the voltage level corresponding to the operation of the voltage level changing section 286.

The operation control signal DLL_CTRL is a signal whose logic level is determined by the operation of the DLL 200. The operation control signal DLL_CTRL is activated to a logic high level while the DLL performs the delay locking operation, and deactivated to a logic low level after the DLL 200 completes the delay locking operation.

That is, the initial voltage level setting section 282 performs a control operation so that the duty cycle correction voltage DCC_VOL has a voltage level corresponding to the operation of the voltage level changing section 286 when the DLL 200 performs the delay locking operation, and the duty cycle correction voltage DCC_VOL is maintained at the level of the division voltage when the DLL 200 completes the delay locking operation.

Figure 4:
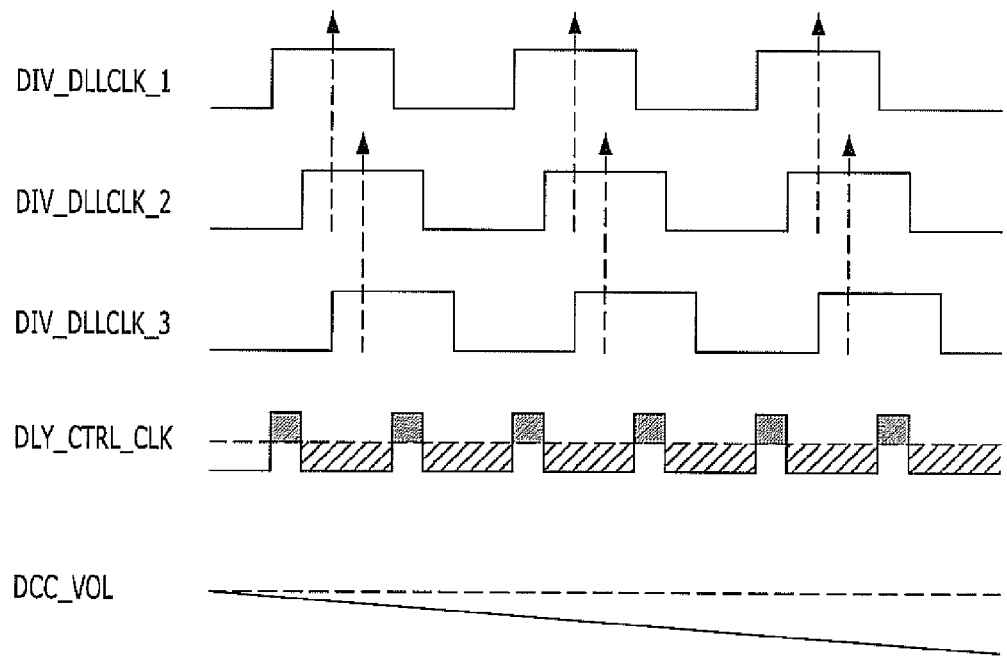
FIGS. 4 to 6 are timing diagrams illustrating a phase difference between DLL division clocks of the DCC circuit shown in FIG. 2
Figure 5:
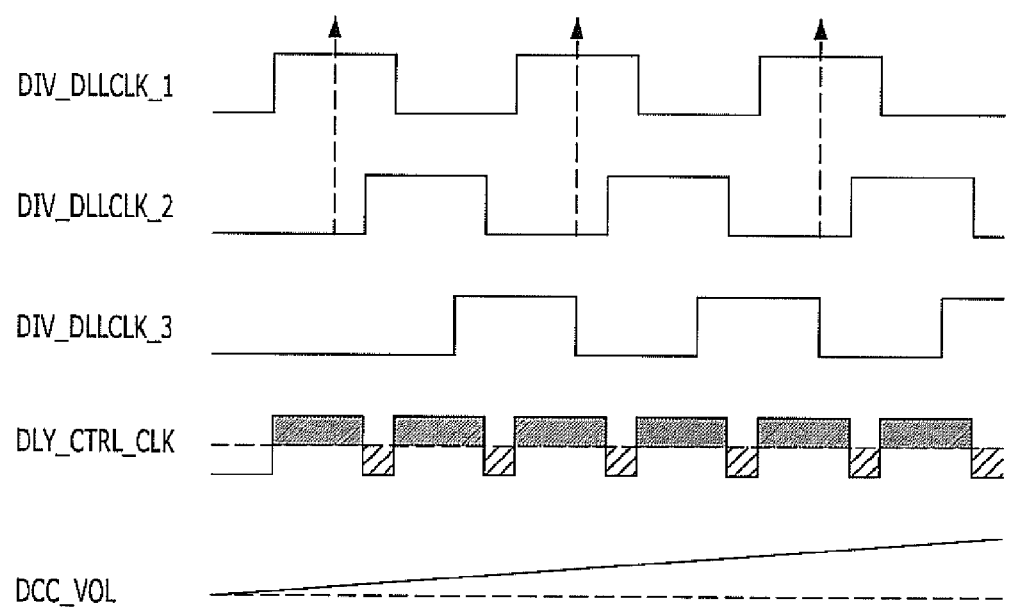
Figure 6:
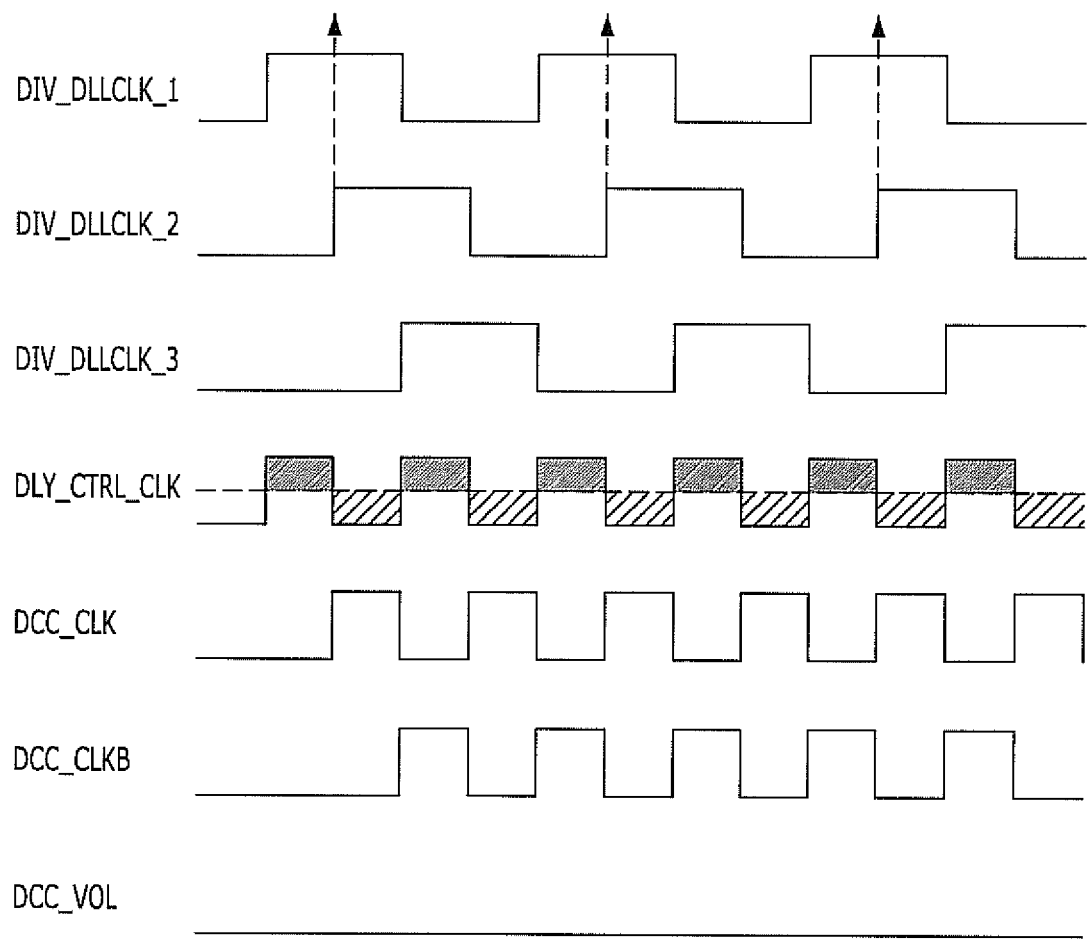

FIGS. 4 to 6 are timing diagrams illustrating the operation of the DCC circuit shown in FIG. 2. Three cases in which the phase difference between the DLL division clocks is less than, more than, or equal to a π/2 phase value are illustrated in FIGS. 4 to 6, respectively.

Referring to FIG. 4, the phase difference between the first DLL division clock DIV_DLLCLK_1 and the second DLL division clock DIV_DLLCLK_2 fails to reach the π/2 phase value, and the phase difference between the second DLL division clock DIV_DLLCLK_2 and the third DLL division clock DIV_DLLCLK_3 fails to reach the π/2 phase value, during the operation of the DCC circuit in accordance with an exemplary embodiment of the present invention.

That is, the rising edge of the second DLL division clock DIV_DLLCLK_2 is not positioned at the center of the duration in which the first DLL division clock DIV_DLLCLK_1 is activated to a logic high level, but rather occurs closer to the rising edge of the first DLL division clock DIV_DLLCLK_1. Furthermore, the falling edge of the second DLL division clock DIV_DLLCLK_2 is not positioned at the center of the duration in which the first DLL division clock DIV_DLLCLK_1 is deactivated to a logic low level, but rather occurs closer to the falling edge of the first DLL division clock DIV_DLLCLK_1.

Likewise, the rising edge of the third DLL division clock DIV_DLLCLK_3 is not positioned at the center of the duration in which the second DLL division clock DIV_DLLCLK_2 is activated to a logic high level, but rather occurs closer to the rising edge of the second DLL division clock DIV_DLLCLK_2. Furthermore, the falling edge of the third DLL division clock DIV_DLLCLK_3 is not positioned at the center of the duration in which the second DLL division clock DIV_DLLCLK_2 is deactivated to a logic low level, but rather occurs closer to the falling edge of the second DLL division clock DIV_DLLCLK_2.

Accordingly, the length of the logic high duration of the delay control clock DLY_CTRL_CLK becomes shorter than the length of the logic low duration of the delay control clock DLY_CTRL_CLK. Although not illustrated, the duty cycle correction clock DCC_CLK takes on a state opposite to the phase of the delay control clock DLY_CTRL_CLK, that is, a state in which the length of the logic low duration is shorter than the length of the logic high duration.

Therefore, as the level of the duty cycle correction voltage (DCC_VOL) terminal changes to a level lower than the initial voltage level, the phase difference between the first DLL division clock DIV_DLLCLK_1 and the second DLL division clock DIV_DLLCLK_2 and the phase difference between the second DLL division clock DIV_DLLCLK_2 and the third DLL division clock DIV_DLLCLK_3 are further increased by increasing the delay amounts of the clock delay unit 240 and the dummy clock delay unit 250.

Referring to FIG. 5, the phase difference between the first DLL division clock DIV_DLLCLK_1 and the second DLL division clock DIV_DLLCLK_2 exceeds the π/2 phase value, and the phase difference between the second DLL division clock DIV_DLLCLK_2 and the third DLL division clock DIV_DLLCLK_3 exceeds the π/2 phase value, during the operation of the DCC circuit in accordance with an exemplary embodiment of the present invention.

That is, the rising edge of the second DLL division clock DIV_DLLCLK_2 is not positioned at the center of the duration in which the first DLL division clock DIV_DLLCLK_1 is activated to a logic high level, but rather occurs closer to the falling edge of the first DLL division clock DIV_DLLCLK_1. Furthermore, the falling edge of the second DLL division clock DIV_DLLCLK_2 is not positioned at the center of the duration in which the first DLL division clock DIV_DLLCLK_1 is deactivated to a logic low level, but rather occurs closer to the rising edge of the first DLL division clock DIV_DLLCLK_1.

Likewise, the rising edge of the third DLL division clock DIV_DLLCLK_3 is not positioned at the center of the duration in which the second DLL division clock DIV_DLLCLK_2 is activated to a logic high level, but rather occurs closer to the falling edge of the second DLL division clock DIV_DLLCLK_2. Furthermore, the falling edge of the third DLL division clock DIV_DLLCLK_3 is not positioned at the center of the duration in which the second DLL division clock DIV_DLLCLK_2 is deactivated to a logic low level, but rather occurs closer to the rising edge of the second DLL division clock DIV_DLLCLK_2.

Accordingly, the length of the logic low duration of the delay control clock DLY_CTRL_CLK becomes shorter than the length of the logic high duration of the delay control clock DLY_CTRL_CLK. Although not illustrated, the duty cycle correction clock DCC_CLK takes on a state opposite to the phase of the delay control clock DLY_CTRL_CLK, that is, a state in which the length of the logic high duration is shorter than the length of the logic low duration.

Therefore, as the level of the duty cycle correction voltage (DCC_VOL) terminal changes to a level higher than the initial voltage level, the phase difference between the first DLL division clock DIV_DLLCLK_1 and the second DLL division clock DIV_DLLCLK_2 and the phase difference between the second DLL division clock DIV_DLLCLK_2 and the third DLL division clock DIV_DLLCLK_3 are further decreased by decreasing the delay amounts of the clock delay unit 240 and the dummy clock delay unit 250.

Referring to FIG. 6, the phase difference between the first DLL division clock DIV_DLLCLK_1 and the second DLL division clock DIV_DLLCLK_2 is equal to the n/2 phase value, and the phase difference between the second DLL division clock DIV_DLLCLK_2 and the third DLL division clock DIV_DLLCLK_3 is equal to the $\pi/2$ phase value, during the operation of the DCC circuit in accordance with an exemplary embodiment of the present invention.

That is, the rising edge of the second DLL division clock DIV_DLLCLK_2 is positioned at the center of the duration in which the first DLL division clock DIV_DLLCLK_1 is activated to a logic high level. Furthermore, the falling edge of the second DLL division clock DIV_DLLCLK_2 is positioned at the center of the duration in which the first DLL division clock DIV_DLLCLK_1 is deactivated to a logic low level.

Likewise, the rising edge of the third DLL division clock DIV_DLLCLK_3 is positioned at the center of the duration in which the second DLL division clock DIV_DLLCLK_2 is activated to a logic high level. Furthermore, the falling edge of the third DLL division clock DIV_DLLCLK_3 is positioned at the center of the duration in which the second DLL division clock DIV_DLLCLK_2 is deactivated to a logic low level.

Accordingly, the length of the logic low duration of the delay control clock DLY_CTRL_CLK becomes equal to the length of the logic high duration of the delay control clock DLY_CTRL_CLK. The duty cycle correction clock DCC_CLK and the inverted duty cycle correction clock DCC_CLKB have their logic low duration equal to their logic high duration.

Therefore, the voltage level of the duty cycle correction voltage (DCC_VOL) terminal is maintained, and the delay amounts of the clock delay unit 240 and the dummy clock delay unit 250 are fixed.

In accordance with the above-described embodiments of the present invention, the duty cycle of the DLL clock DLLCLK is accurately adjusted to a 50% ratio by dividing the phase of the DLL clock DLLCLK, and the plurality of DLL division clocks DIV_DLLCLK_1, DIV_DLLCLK_2, and DIV_DLLCLK_3, having a certain phase differences, are generated. The duty cycles of the duty cycle correction clock DCC_CLK and the inverted duty cycle correction clock DCC_CLKB are corrected by using the variation in the phases of the DLL division clocks DIV_DLLCLK_1, DIV_DLLCLK_2, and DIV_DLLCLK_3. In this way, the duty correction clock DCC_CLK and the inverted duty cycle correction clock DCC_CLKB, which have the same frequency as the DLL clock DLLCLK and have the duty cycle of 50%, can be generated.

The duty correction clock DCC_CLK and the inverted duty cycle correction clock DCC_CLKB may be generated, while reducing an amount of current consumed during the DCC operation.

Furthermore, the configuration of the circuits for the DCC operation is simplified and the circuits occupy a small area. Moreover, the DCC operation can be stably performed even though the circuits occupy a minimized area.

Although the DCC circuit configured to receive the DLL clock DLLCLK and perform the DCC operation is described in the foregoing embodiments, the DCC circuit may also be configured to receive a clock whose duty cycle ratio is not 50% and perform the DCC operation.

In accordance with exemplary embodiments of the present invention, the phase of the DLL clock is divided, and the duty cycle of the DCC clock is corrected using the variation in the divided phase of the DLL clock. In this way, the DCC clock having the same frequency as the DLL clock can be generated. Thus, an amount of current consumed during the DCC operation can be reduced.

While the present invention has been described with respect to the specific embodiments, it will be apparent to those skilled in the art that various changes and modifications may be made without departing from the spirit and scope of the invention as defined in the following claims.

For example, positions and types of the logic gates and transistors used in the foregoing embodiments may be changed depending on polarities of the input signals.

What is claimed is:

1. A semiconductor device comprising:
    a delay locked loop (DLL) configured to compare a phase of a source clock with a phase of a feedback clock and delay the source clock depending on a comparison result to output a DLL clock, the feedback clock being generated by reflecting an actual delay amount of a source clock path in the DLL clock;
    a phase division unit configured to divide a phase of the DLL clock according to a certain division ratio to generate a first DLL division clock;
    a clock delay unit configured to delay the first DLL division clock by a delay amount corresponding to a voltage level of a duty cycle correction voltage to output a second DLL division clock;
    a duty cycle correction clock generation unit configured to generate a duty cycle correction clock whose logic level changes at respective edges of the first DLL division clock and the second DLL division clock; and a duty cycle correction voltage generation unit configured to generate the duty cycle correction voltage whose voltage level changes depending on a duty cycle of the duty cycle correction clock.

2. The semiconductor device of claim 1, further comprising:

a dummy clock delay unit configured to delay the second DLL division clock by the delay amount corresponding to the voltage level of the duty cycle correction voltage to output a third DLL division clock; and an inverted duty cycle correction clock generation unit configured to generate an inverted duty cycle correction clock whose logic level changes at respective edges of the second DLL division clock and the third DLL division clock.

3. The semiconductor device of claim 1, wherein the phase division unit is configured to divide the phase of the DLL clock by half to generate the first DLL division clock having half the frequency of the DLL clock.

4. The semiconductor device of claim 1, wherein the clock delay unit is configured to output the second DLL division clock by delaying the first DLL division clock by the delay amount which decreases according to an increase in the voltage level of the duty cycle correction voltage and increases according to a decrease in the voltage level of the duty cycle correction voltage.

5. The semiconductor device of claim 2, wherein the dummy clock delay unit is configured to output the third DLL division clock by delaying the second DLL division clock by the delay amount which decreases according to an increase in the voltage level of the duty cycle correction voltage and increases according to a decrease in the voltage level of the duty cycle correction voltage.

6. The semiconductor device of claim 1, wherein the duty cycle correction clock generation unit is configured to change the duty cycle correction clock to a logic high level at the respective edges of the first DLL division clock and to a logic low level at the respective edges of the second DLL division clock.

7. The semiconductor device of claim 6, wherein the duty cycle correction clock generation unit comprises an exclusive NOR (XNOR) gate configured to perform an XNOR operation on the first DLL division clock and the second DLL division clock, which are received through a first input terminal and a second input terminal, respectively, and output the duty cycle correction clock.

8. The semiconductor device of claim 2, wherein the inverted duty cycle correction clock generation unit is configured to change the inverted duty cycle correction clock to a logic high level at the respective edges of the second DLL division clock and to a logic low level at the respective edges of the third DLL division clock.

9. The semiconductor device of claim 8, wherein the inverted duty cycle correction clock generation unit comprises an exclusive NOR (XNOR) gate configured to perform an XNOR operation on the second DLL division clock and the third DLL division clock, which are received through a first input terminal and a second input terminal, respectively, and output the inverted duty cycle correction clock.

10. The semiconductor device of claim 2, wherein the duty cycle correction voltage generation unit comprises:

an initial voltage level setting section configured to set an initial voltage level of the duty cycle correction voltage in response to an operation control signal;

a clock inversion driving section configured to invert the duty cycle correction clock to output a delay control clock; and a voltage level changing section configured to change the level of the duty cycle correction voltage according to a duty cycle of the delay control clock.

11. The semiconductor device of claim 10, further comprising a dummy clock inversion driving unit coupled to an output terminal of the inverted duty cycle correction clock generation unit and configured to invert the inverted duty cycle correction clock.

12. The semiconductor device of claim 10, wherein the initial voltage level setting section is configured to divide a level of an external power supply voltage according to a certain division ratio and supply a division voltage as the duty cycle correction voltage in response to the operating control signal.

13. The semiconductor device of claim 12, wherein the initial voltage level setting section is configured to apply the division voltage to a duty cycle correction voltage terminal in a deactivation duration of the operation control signal, wherein the duty cycle correction voltage terminal maintains a voltage level of the division voltage during the deactivation duration and has a voltage level corresponding to an operation of the voltage level changing section in an activation duration of the operation control signal.

14. The semiconductor device of claim 13, wherein the operation control signal is a signal whose logic level is determined by a DLL operation of the DLL, and the operation control signal is activated when the DLL performs the DLL operation.

15. The semiconductor device of claim 10, wherein the voltage level changing section is configured to change the level of the duty cycle correction voltage by low-pass filtering the delay control clock.

16. The semiconductor device of claim 15, wherein the voltage level changing section is configured to increase the voltage level of the duty cycle correction voltage in a logic high duration of the delay control clock, and to decrease the voltage level of the duty cycle correction voltage in a logic low duration of the delay control clock.

17. A semiconductor device comprising:

a phase division unit configured to divide a phase of a source clock according to a certain division ratio to generate a first division clock;

a clock delay unit configured to delay the first division clock by a delay amount corresponding to a voltage level of a duty cycle correction voltage to output a second division clock;

a duty cycle correction clock generation unit configured to generate a duty cycle correction clock whose logic level changes at respective edges of the first division clock and the second division clock; and a duty cycle correction voltage generation unit configured to generate the duty cycle correction voltage whose voltage level changes depending on a duty cycle of the duty cycle correction clock.

18. The semiconductor device of claim 17, further comprising:

a dummy clock delay unit configured to delay the second division clock by the delay amount corresponding to the voltage level of the duty cycle correction voltage to output a third division clock; and an inverted duty cycle correction clock generation unit configured to generate an inverted duty cycle correction clock whose logic level changes at respective edges of the second division clock and the third division clock.

19. The semiconductor device of claim 17, wherein the phase division unit is configured to divide the phase of the source clock by half to generate the first division clock having half the frequency of the source clock.

20. The semiconductor device of claim 17, wherein the clock delay unit is configured to output the second division clock by delaying the first division clock by the delay amount which decreases according to an increase in the voltage level of the duty cycle correction voltage and increases according to a decrease in the voltage level of the duty cycle correction voltage.

21. The semiconductor device of claim 18, wherein the dummy clock delay unit is configured to output the third division clock by delaying the second division clock by the delay amount which decreases according to an increase in the voltage level of the duty cycle correction voltage and increases according to a decrease in the voltage level of the duty cycle correction voltage.

22. The semiconductor device of claim 17, wherein the duty cycle correction clock generation unit is configured to change the duty cycle correction clock to a logic high level at the respective edges of the first division clock and to a logic low level at the respective edges of the second division clock.

23. The semiconductor device of claim 22, wherein the duty cycle correction clock generation unit comprises an exclusive NOR (XNOR) gate configured to perform an XNOR operation on the first division clock and the second division clock, which are received through a first input terminal and a second input terminal, respectively, and output the duty cycle correction clock.

24. The semiconductor device of claim 18, wherein the inverted duty cycle correction clock generation unit is configured to change the inverted duty cycle correction clock to a logic high level at the respective edges of the second division clock and to a logic low level at the respective edges of the third division clock.

25. The semiconductor device of claim 24, wherein the inverted duty cycle correction clock generation unit comprises an exclusive NOR (XNOR) gate configured to perform an XNOR operation on the second division clock and the third division clock, which are received through a first input terminal and a second input terminal, respectively, and output the inverted duty cycle correction clock.

26. The semiconductor device of claim 18, wherein the duty cycle correction voltage generation unit comprises:

an initial voltage level setting section configured to set an initial voltage level of the duty cycle correction voltage in response to an operation control signal;
a clock inversion driving section configured to invert the duty cycle correction clock to output a delay control clock; and
a voltage level changing section configured to change the level of the duty cycle correction voltage according to a duty cycle of the delay control clock.

27. The semiconductor device of claim 26, further comprising a dummy clock inversion driving unit coupled to an output terminal of the inverted duty cycle correction clock generation unit and configured to invert the inverted duty cycle correction clock.

28. The semiconductor device of claim 26, wherein the initial voltage level setting section is configured to divide a level of an external power supply voltage according to a certain division ratio and supply a division voltage as the duty cycle correction voltage in response to the operating control signal.

29. The semiconductor device of claim 28, wherein the initial voltage level setting section is configured to apply the division voltage to a duty cycle correction voltage terminal in a deactivation duration of the operation control signal, wherein the duty cycle correction voltage terminal maintains a voltage level of the division voltage during the deactivation duration and has a voltage level corresponding to an operation of the voltage level changing section in an activation duration of the operation control signal.

30. The semiconductor device of claim 29, wherein the operation control signal is a signal whose logic level is determined by a DLL operation of the DLL, and the operation control signal is activated when the DLL performs the DLL operation.

31. The semiconductor device of claim 26, wherein the voltage level changing section is configured to change the voltage level of the duty cycle correction voltage by low-pass filtering the delay control clock.

32. The semiconductor device of claim 31, wherein the voltage level changing section is configured to increase the voltage level of the duty cycle correction voltage in a logic high duration of the delay control clock, and to decrease the voltage level of the duty cycle correction voltage in a logic low duration of the delay control clock.

* * * * *